Aug. 19, 1969 K. HENNINGS ET AL 3,462,650

ELECTRICAL CIRCUIT MANUFACTURE

Filed May 6, 1966 2 Sheets-Sheet 1

INVENTORS
Klaus Hennings
Hans-Jürgen Schütze &
Gerhard Ulbricht

BY Spencer & Kaye
ATTORNEYS

INVENTORS
Klaus Hennings
Hans-Jürgen Schütze &
Gerhard Ulbricht

BY Spencer & Kaye
ATTORNEYS

United States Patent Office 3,462,650
Patented Aug. 19, 1969

3,462,650
ELECTRICAL CIRCUIT MANUFACTURE
Klaus Hennings and Hans-Jürgen Schütze, Ulm (Danube), and Gerhard Ulbricht, Neu-Ulm (Danube), Germany, assignors to Telefunken Patentverwertungsgesellschaft m.b.H., Ulm (Danube), Germany
Filed May 6, 1966, Ser. No. 548,279
Claims priority, application Germany, May 7, 1965, T 28,536
Int. Cl. H01l 19/00, 11/00
U.S. Cl. 317—101 11 Claims

ABSTRACT OF THE DISCLOSURE

An integrated circuit arrangement disposed on a semiconductor body and composed of active semiconductor components, passive components and conducting paths connecting together the various components, there being at least one component on each of two opposed surfaces of the semiconductor body and the body being formed to present conductive path connections which extend therethrough to permit connections to be made between the two body surfaces.

Figure 1A:
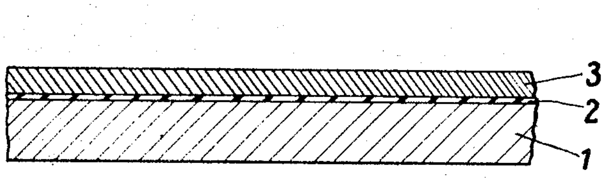

The present invention relates to the manufacture of electrical circuit arrangements, and particularly to circuits of the solid state type.

The present invention is particularly concerned with solid state circuits of the type including a semiconductor body having active components formed therein and provided with an insulating layer which is disposed on the semiconductor body and which has passive components and conducting paths applied thereto.

In the construction of solid state circuits, it has heretofore been the practice to provide a semiconductor wafer having a passivating layer on its upper surface and to place preferably active components into the semiconductor body below the passivating layer and passive components and conducting paths on this passivating layer. Thus, the lower surface of the semiconductor wafer is not utilized for mounting the circuit components and the wafer is generally mounted on a housing or a carrier by soldering or cementing its lower surface thereto.

When such a technique is employed, a considerable portion of the upper surface of the semiconductor wafer must be used as a carrier for the passive components. In fact, the amount of surface area required for the passive elements is often a multiple of the total surface area occupied by the transistors and other active components. This is particularly true in circuits intended to operate in the microwatt and nanowatt range because the transistors required for such circuits are most often exceptionally small, while the associated resistors must have high resistance values and thus generally cover relatively large surface areas. As a result, the total circuitry which can be placed on a wafer for the construction of circuits of this type is, as a practical matter, limited by the surface area requirements of the passive components.

When circuits are constructed according to the recently disclosed separation method, which employs embedded insulating layers, the large surface area requirement for the passive components becomes especially disadvantageous since this separation method increases the cost of finished semiconductor wafers, particularly in cases where the starting material is originally provided with an epitaxial layer.

It is therefore a primary object of the present invention to overcome these difficulties and drawbacks.

A more specific object of the present invention is to substantially increase the amount of circuitry which can be placed on a semiconductor wafer of a given size.

A still more specific object of the present invention is to permit circuit elements to be disposed on both surfaces of a semiconductor wafer.

It is another object of the present invention to provide a solid state circuit consisting of a semiconductor body having active components provided therein and an insulating layer disposed on the semiconductor body and having passive components and conductive paths applied thereon in such a manner that the total circuitry which can be provided on a given semiconductor wafer is substantially increased.

According to the present invention, these and other objects are achieved by the provision of a solid state circuit unit including a semiconductor body having an upper surface and a lower surface, at least one active semiconductor component disposed in the body, and an insulating layer disposed on each surface of the body. The unit is further provided with passive components and conducting paths disposed on the insulating layer on each surface of the body and with means conductively connecting the components and conducting paths at one surface of the body with those at the other surface thereof.

The present invention also involves a method for producing a unit of the type described above which includes the steps of covering one surface of a monocrystalline semiconductor body with a first insulating layer and disposing a first supporting layer of polycrystalline semiconductor material on this first insulating layer. The body is then selectively etched, starting from the surface thereof which is opposite the first-mentioned surface, to form individual semiconductor regions and projections. The exposed surfaces of these regions and projections are then provided with a low-resistivity layer having the same conductivity type as the body. A second insulating layer is then disposed on that surface of the resulting unit in which the projections and regions were formed and then with a second supporting layer of polycrystalline semiconductor material. Then at least part of the second supporting layer is removed to form a flat surface and to expose those portions of the second insulating layer which cover the ends of the projections, and a third insulating layer is disposed on this flat surface and on the exposed portions of the second insulating layer. Thereafter, the first supporting layer is removed and active semiconductor components are formed in the individual semiconductor regions. Finally, ohmic contacts are formed at both ends of the individual semiconductor projections, and passive components and conductive paths are applied on both sides of the resulting arrangements and are connected to the ohmic contacts.

One of the principal advantages obtained by the present invention is a substantial doubling of the total surface area available for semiconductor circuitry as a result of the placing of passive components and conductive paths on both surfaces of the semiconductor body, or wafer.

Additional objects and advantages of the present invention will become apparent upon consideration of the following description when taken in conjunction with the accompanying drawings in which:

FIGURE 1*a* is a cross-sectional view of a portion of an arrangement in one stage of fabrication according to the present invention.

Figure 1B:
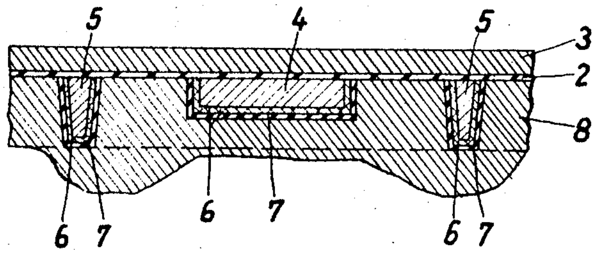

FIGURE 1*b* is a view similar to that of FIGURE 1 of the arrangement in a further stage of fabrication.

Figure 1C:
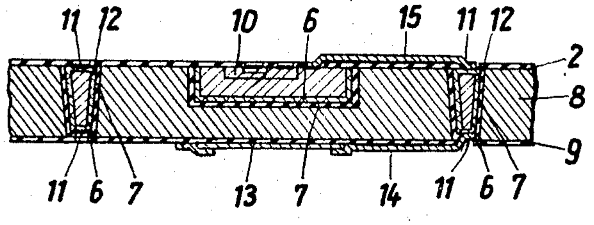

FIGURE 1*c* is another view similar to that of FIGURE 1*a* showing the arrangement in a still further stage of fabrication.

Figure 2:
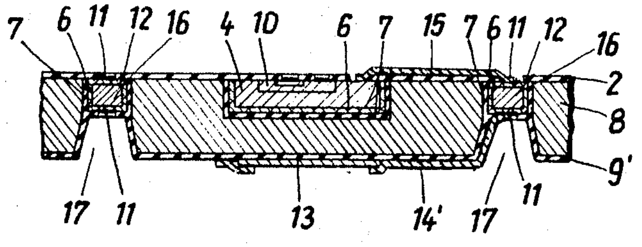

FIGURE 2 is a cross-sectional view of a portion of another unit according to the present invention.

Figure 3A:
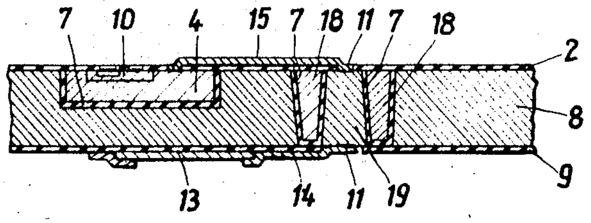

FIGURE 3*a* is a view similar to that of FIGURE 1*a* of another arrangement according to the present invention in a first stage of fabrication.

Figure 3B:
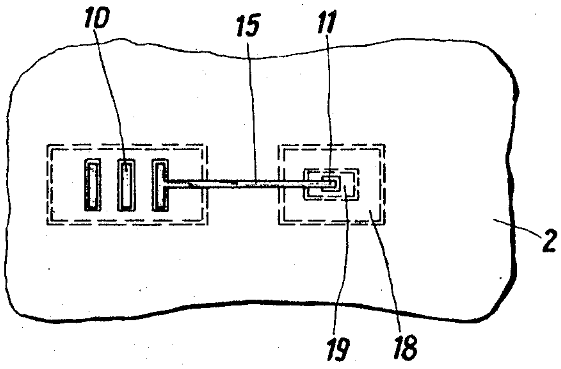

FIGURE 3*b* is a plan view of the arrangement of FIGURE 3*a*.

Figure 4:
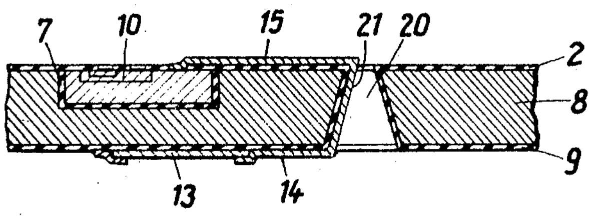

FIGURE 4 is a view similar to that of FIGURE 1*a* of a portion of another arrangement according to the present invention.

Referring now in detail to FIGURE 1, FIGURE 1*a* shows a portion of a starting arrangement constituted by a semiconductor body, or wafer, 1 on which are disposed an insulating layer 2, constituted by an oxide of the material of body 1 for example, and a supporting layer 3, made of polycrystalline semiconductor material for example.

As is shown in FIGURE 1*b*, the semiconductor body 1 is then selectively etched, starting from its lower side and using a two-step masking technique if required, in such a way as to leave only monocrystalline regions 4 and projections 5. Then, impurity atoms leading to the same conductivity type as the semiconductor body 1 are diffused into the semiconductor regions 4 and into the projections 5 so as to produce low-resistivity layers 6 on the exposed surfaces thereof. These layers 6 could also be produced, according to the present invention, by the deposition of metallic conducting layers rather than by diffusing and these metallic layers may, if desired, be subsequently alloyed in.

After layers 6 have been produced, they are covered with insulating layers 7 and then the lower surface of the resulting unit is covered with a preferably polycrystalline semiconductor supporting layer 8. A portion of this latter supporting layer is then removed to the level of the broken line to produce a smooth lower surface which is flush with, and which exposes, those portions of the second insulating layer which cover the ends of the projections 5.

Then, as is shown in FIGURE 1*c*, a third insulating layer 9 is applied to the lower surface of the resulting arrangement. Thereafter, the supporting layer 3 is removed and an active semiconductor component, such as a transistor 10, is formed in each monocrystalline semiconductor region 4. It should be appreciated that units constructed according to the present invention may have one or more semiconductor regions 4, and that only one such region is shown herein for purposes of simplicity. The active semiconductor components may be formed in these regions 4 by any well known process, such as by diffusion for example.

After these active components have been formed, portions of the insulating layers 2 and 9 are removed in the regions adjacent both ends of projections 5. Such a removal of portions of the semiconductor layer 2 serves to expose a portion of the upper end of each projection 5. The removal of portions of insulating layer 9 is accompanied by a removal of corresponding portions of the insulating layers 7 which are disposed on the lower ends of projections 5. This removal serves to expose the portion of the low-resistivity layer 6 covering this lower end of each projection. 5. Within the openings formed by the removal of portions of layers 2, 7 and 9 are disposed ohmic contacts 11. The contacts 11 at the lower ends of projections 5 are alloyed into layers 6. In order to produce a low resistance connection between the contacts 11 at the upper ends of the projections 5 and the low-resistivity layers 6 associated with these projections, low-resistivity regions 12 are produced below insulating layer 2 in the upper ends of projections 5, preferably at the same time as the diffusion operation employed for producing the emitter of transistor 10. Subsequently, the ohmic contacts 11 disposed at the upper ends of projections 5 are preferably alloyed into these regions 12. The low-resistivity layer 6 and region 12 associated with each projection 5 thus serve to provide a low resistance connection between each ohmic contact 11 disposed at the upper end of a projection 5 and the contact 11 disposed at the lower end thereof.

At the same time that openings are formed opposite projections 5 in layer 2, openings are also formed in this layer opposite the various semiconductor regions of transistor 10 and each of these transistor regions is provided with an electrode.

Thereafter, passive components and conducting paths are applied on both surfaces of the resulting semiconductor arrangement, appropriate ends of selected conducting paths being connected to associated ones of the ohmic contacts 11. As is shown in an exemplary manner in FIGURE 1*c*, a collector resistor 13 is applied to insulating layer 9 and is connected to the collector zone of transistor 10 by means of conducting path 14, the low-resistivity layer 6 surrounding the right-hand projection 5, and the conducting path 15. The thicknesses of paths 14 and 15, as well as those of contacts 11 are shown greatly exaggerated for purposes of illustration.

Referring now to FIGURE 2, there is shown another arrangement produced according to the present invention wherein the monocrystalline regions 4 and regions, or projections 16 are formed in a semiconductor body in a manner similar to that described above in connection with FIGURES 1*a* and 1*b*. In this arrangement, projections 16 extend to the same height as regions 4. The exposed surfaces of these regions are then covered with low-resistivity layers 6, and then with insulating layers 7, and finally with a supporting layer 8. A portion of the supporting layer 8 is then removed to form a smooth, flat lower surface. Then, below projections 16, recesses 17 are etched from below into supporting layer 8. These recesses 17 are preferably etched by a selective etching process which acts only on the semiconductor material of layer 8 and which has no effect on the material of insulating layers 7. These recesses 17 are etched to a sufficient depth to expose the portions of insulating layers 7 covering the lower ends of projections 16. Since in this arrangement the projections 16 have the same depth as the regions 4, they can be formed in a simpler manner than in the arrangement of FIGURES 1.

After the recesses 17 have been formed, the lower surface of the resulting arrangement is covered with an insulating layer 9' and openings are formed in insulating layers 2, 7 and 9' to expose a portion of the upper surface of each projection 16 and a portion of the layer 6 covering the lower surface of each projection 16. A low-resistivity region 12 is then formed in the upper surface of each projection 16, preferably at the same time as the formation of the emitter region in transistor 10.

In each of the openings formed opposite the ends of projections 16 there is provided an ohmic contact 11 which is electrically connected, by alloying for example, either to low-resistivity layer 6 or to low-resistivity region 12. Then, as in the embodiments of FIGURES 1, passive components and conducting paths are formed on insulating layers 2 and 9'. For example, a resistor 13 is disposed on layer 9' and is connected to the collector zone of transistor 10 by means of a conducting path 14' which extends along the slanted wall of right-hand recess 17, the low-resistivity layer surrounding projection 16, and conducting path 15.

In further accordance with the present invention, it is also possible to proceed by forming the monocrystalline regions 4 and projections 5 or 16 in one surface of a semiconductor body without first mounting this body on a supporting layer. This may be accomplished, for example, by first etching, with the aid of a suitable masking, one surface of the body to form recesses separating projections which will constitute regions 4 and projections 5 or 16. The surface produced by this etching would then be provided with low-resistivity layers 6, an insulating layer 7, and a supporting layer 8 which is preferably made of a polycrystalline semiconductor material, and portions of the supporting layer 8 would be subsequently removed to provide a flat, smooth surface. Then, portions of the original semiconductor body would be removed to leave isolated regions 4 and projections 5 and 16 of the desired thickness. Thereafter, an insulating layer 2 may be applied to give the assembly the form shown in FIGURE 1*b* for example, and the resulting arrangement may be subjected to further operations of the type described above.

Referring now to FIGURES 3*a* and 3*b*, there is shown another arrangement produced according to the present invention. In the production of this arrangement, a semiconductor body is covered with an insulating layer 2 and a supporting layer (which is subsequently removed prior to the stage of fabrication illustrated). Portions of the semiconductor body are then removed, starting from the lower surface thereof, in order to leave monocrystalline regions 4 and hollow projections 18. The exposed surfaces of these regions and projections are then covered with insulating layers 7 and with a highly doped, low-resistivity polycrystalline semiconductor layer 8. Portions of the layer 8 are then removed to create a flat, smooth surface and to expose the portions of layer 7 which lie opposite the lower ends of projections 18. A low-resistivity region 19 is thus formed by the portion of layer 8 disposed in the space surrounded by each hollow projection 18, region 19 being electrically insulated from projection 18 and from the remainder of layer 8 by insulating layer 7. Then an insulating layer 9 is deposited on the lower surface of the resulting arrangement and openings are provided in layers 2 and 9 opposite the upper and lower surfaces, respectively, of each region 19. Ohmic contacts 11 are then provided in these openings and are electrically connected to region 19.

This form of construction has the advantage that it eliminates the necessity for diffusing low-resistivity layers onto the surfaces of projections 18 and that the provision of two concentrically arranged insulating layers 7 on each projection serves to reduce shunt capacitances resulting from the presence of these projections. If the capacitances and conducting path resistances of the arrangement are of no great significance for a particular application, the hollow projections 18 can be provided with a suitable low-resistivity layer and can be employed as additional conductive connections.

The arrangement of FIGURE 3 can also be modified in the manner shown in FIGURE 2 so as to give projections 18 the same height as the regions 4. In this modified form of construction, the regions 19 would be exposed by providing suitable recesses similar to the recesses 17 of FIGURE 2.

FIGURE 4 shows another form of construction according to the present invention in which the regions corresponding to projections 5 of FIGURE 1 or projections 16 of FIGURE 2 are removed by a selective etching process. In this case, the step of diffusing low-resistivity layers 6 is eliminated.

The resulting arrangement will be provided with holes 20 extending completely therethrough, these holes having more or less inclined walls along which a conducting path may be applied which extends from one surface to the other of the semiconductor body. In one technique according to the present invention, it is possible to etch the holes directly into the original semiconductor body and to subsequently apply the insulating layers upon the resulting hole walls. As is shown in FIGURE 4, a conducting path 14 is applied to the lower surface of the arrangement and is connected to a conducting path 15, which is applied to the upper surface thereof, through the intermediary of a path portion 21 extending along the insulating layer covering the wall of hole 20.

Processes according to the present invention, can also be carried out using an epitaxial semiconductor body having a low-resistivity substrate. In this case, it is possible, according to the present invention, especially where the exact value of the path resistance of the conductive connection through the semiconductor body is not critical, to eliminate the diffusion operation by which low-resistivity layers 6 are produced in the arrangements of FIGURES 1 and 2. However, in most cases, a low-resistivity layer 6 will be provided for permitting a low resistance connection to the collector of transistor 10 to be obtained, so that no additional process step would be necessary.

It will be understood that the above description of the present invention is susceptible to various modifications, changes, and adaptations, and the same are intended to be comprehended within the meaning and range of equivalents of the appended claims.

What is claimed is:

1. A solid state circuit unit comprising, in combination:

(a) a semiconductor body having an upper surface and a lower surface;

(b) at least one active semiconductor component disposed in said body;

(c) an insulating layer disposed on each said surface of said body;

(d) passive components and conducting paths disposed on said layer on each said surface of said body; and (e) means conductively connecting said components and conducting paths at one said surface of said body with those at the other said surface thereof, said means including separated semiconductor regions embedded in said semiconductor body and extending from said upper surface to said lower surface of said body, and insulating material separating each said region from said body.

2. An arrangement as defined in claim 1 wherein said semiconductor body is made of a polycrystalline semiconductor material having monocrystalline semiconductor regions, each of which contains a respective one of said active components, and said separated semiconductor regions are made of monocrystalline semiconductor material.

3. An arrangement as defined in claim 2 wherein each of said separated semiconductor regions of monocrystalline material is completely surrounded by said insulating material.

4. An arrangement as defined in claim 3 wherein each of said separated monocrystalline regions is provided at its surface with a low-resistivity layer having the same conductivity type as said semiconductor body.

5. An arrangement as defined in claim 4 wherein said insulating layers disposed on each said surface of said body are provided with openings at the locations where they cover said separated regions, and wherein said means conductively connecting said components and conducting paths include ohmic contacts disposed in said openings and electrically connected to their respective regions and to selected ones of said conducting paths.

6. An arrangement as defined in claim 3 wherein said insulating material is constituted by further insulating layers each surrounding a respective separated region and said semiconductor body is provided with recesses extending from one surface thereof, each of which recesses extends to said further insulating layer surrounding a respective one of said separated regions.

7. An arrangement as defined in claim 2 wherein each of said separated monocrystalline semiconductor regions has a hollow configuration and surrounds a low-resistivity polycrystalline region which also extends from said upper surface to said lower surface of said semiconductor body and which constitutes a portion of said body.

8. An arrangement as defined in claim 7 wherein said insulating layers disposed on each said surface of said body are provided with openings in regions where they cover each said low-resistivity polycrystalline region, and wherein said means conductively connecting said components and conducting paths include ohmic contacts disposed in said openings and electrically connected to said low-resistivity polycrystalline regions and to selected ones of said conducting paths.

9. An arrangement as defined in claim 7 wherein each of said separated regions has its surface provided with a low-resistivity layer, and said insulating layers disposed on each said surface of said body are provided with openings in regions where they cover said separated regions, and wherein said means conductively connecting said components and conducting paths include ohmic contacts disposed in said openings and conductively connected to each said low-resistivity layer on the surface of a respective separated region and to selected ones of said conducting paths.

10. A solid state circuit unit comprising, in combination:

(a) A semiconductor body having an upper surface and a lower surface and provided with holes which extend from its said upper surface to its said lower surface;
(b) at least one active semiconductor component disposed in said body;
(c) an insulating layer disposed on each said surface of said body;
(d) passive components and conducting paths disposed on said layer on each said surface of said body;
(e) an insulating layer covering the walls of each said hole; and
(f) means extending along the walls of said holes from said upper surface to said lower surface of said semiconductor body and conductively connecting said components and conducting paths at one said surface of said body with those at the other said surface thereof.

11. A solid state circuit unit comprising, in combination:

(a) a semiconductor body constituted by a low resistivity substrate and having an upper surface and a lower surface;
(b) an active semiconductor component disposed in said body and constituted by a portion of an epitaxial layer disposed on said substrate;
(c) an insulating layer disposed on each said surface of said body;
(d) passive components and conducting paths disposed on said layer on each said surface of said body; and
(e) means conductively connecting said components and conducting paths at one said surface of said body with those at the other said surface thereof.

References Cited

UNITED STATES PATENTS

| | | | |
|---|---|---|---|
| 3,137,796 | 6/1964 | Luscher. | |
| 3,150,299 | 9/1964 | Noyce. | |
| 3,350,760 | 11/1967 | Kilby. | |
| 3,381,182 | 4/1968 | Thornton | 317—234 |

ROBERT K. SCHAEFER, Primary Examiner

J. R. SCOTT, Assistant Examiner

U.S. Cl. X.R.

317—235